(12) United States Patent
Wang et al.

(10) Patent No.: US 6,291,887 B1
(45) Date of Patent: Sep. 18, 2001

(54) DUAL DAMASCENE ARRANGEMENTS FOR METAL INTERCONNECTION WITH LOW K DIELECTRIC CONSTANT MATERIALS AND NITRIDE MIDDLE ETCH STOP LAYER

(75) Inventors: Fei Wang, San Jose; Jerry Cheng, Milpitas; Todd Lukanc, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,220

(22) Filed: Jan. 4, 1999

(51) Int. Cl.$^7$ .................................................. H01L 23/48
(52) U.S. Cl. .................. 257/758; 257/759; 257/751; 257/752; 438/637; 438/638; 438/645; 438/687
(58) Field of Search .................. 257/758, 759, 257/751, 752, 762; 438/637, 638, 645, 623, 624

(56) References Cited

U.S. PATENT DOCUMENTS

| 5,310,454 | 5/1994 | Ohiwa et al. ........................ 156/643 |
| 5,340,370 | 8/1994 | Cadien et al. ........................ 51/308 |
| 5,354,712 | 10/1994 | Ho et al. ........................ 437/195 |
| 5,612,254 | 3/1997 | Mu et al. ........................ 437/195 |
| 5,659,201 | 8/1997 | Wollesen ........................ 257/758 |
| 5,679,608 | 10/1997 | Cheung et al. ........................ 437/195 |
| 5,693,563 | 12/1997 | Teong ........................ 437/190 |
| 5,705,430 | 1/1998 | Avanzino et al. ........................ 437/195 |
| 5,736,457 | 4/1998 | Zhao ........................ 438/624 |
| 5,739,579 | 4/1998 | Chiang et al. ........................ 257/635 |
| 5,741,626 | 4/1998 | Jain et al. ........................ 438/314 |
| 5,753,967 | * 5/1998 | Lin ........................ 257/635 |
| 5,801,094 | 9/1998 | Yew et al. ........................ 438/624 |
| 5,817,572 | 10/1998 | Chiang et al. ........................ 438/624 |
| 5,861,677 | 1/1999 | You et al. ........................ 257/783 |
| 5,880,018 | * 3/1999 | Boeck et al. ........................ 438/619 |
| 5,916,823 | 6/1999 | Lou et al. ........................ 438/738 |
| 6,037,664 | * 3/2000 | Zhao et al. ........................ 257/758 |
| 6,100,184 | * 8/2000 | Zhao et al. ........................ 438/638 |

OTHER PUBLICATIONS

Stanley Wolf and Richard Tauber, Silicon processing the VLSI era, vol. 1, pp. 555.

* cited by examiner

Primary Examiner—Matthew Smith
Assistant Examiner—Belur Keshavan

(57) ABSTRACT

A method of forming a dual damascene structure in a semiconductor device arrangement forms a first low k dielectric material over an underlying metal interconnect layer, such as a copper interconnect layer. A nitride etch stop layer is formed on the first low k dielectric layer, and a second low k dielectric layer is formed on the nitride etch stop layer. A via is etched into the first low k dielectric layer, and a trench is then etched into the second low k dielectric layer. The first and second low k dielectric materials are different from one another so that they have different sensitivity to at least one etchant chemistry. Undercutting in the first dielectric layer is thereby prevented during the etching of the trench in the second dielectric layer by employing an etch chemistry that etches only the second low k dielectric material and not the first low k dielectric material.

7 Claims, 4 Drawing Sheets

DUAL DAMASCENE ARRANGEMENTS FOR METAL INTERCONNECTION WITH LOW K DIELECTRIC CONSTANT MATERIALS AND NITRIDE MIDDLE ETCH STOP LAYER

RELATED APPLICATIONS

The present applications contains subject matter related to subject matter disclosed in copending U.S. patent applications Ser. No. 09/225,543 filed on Jan. 5, 1999, Ser. No. 09/238,050 filed on Jan. 27, 1999 and Ser. No. 09/238,049 filed on Jan. 27, 1999.

FIELD OF THE INVENTION

The present invention relates to the formation of metal interconnection layers during the manufacture of semiconductor devices, and more particularly to the formation of a damascene structure in a metal interconnect region.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising 5 or more levels of metalization are becoming more prevalent as device geometries shrink to submicron levels.

A conductive plug filling a via hole is typically formed by depositing a dielectric interlayer on a conductive layer comprising at least one conductive pattern, forming an opening in the dielectric interlayer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and, hence, the circuit speed. As integration density increases and feature size decreases in accordance with sub-micron design rules, e.g., a design rule of about 0.18 $\mu$ and below the rejection rate due to integrated circuit speed delays severely limits production throughput and significantly increases manufacturing costs.

In prior technologies, aluminum was used in very large scale integration interconnect metalizations. Copper and copper alloys have received considerable attention as a candidate for replacing aluminum in these metalizations. Copper has a lower resistivity than aluminum and improved electrical properties vis-a-vis tungsten, making copper a desirable metal for use as a conductive plug as well as conductive wiring.

In the formation of a dual damascene structure, a conductive line and vias that connect the line to conductive elements in a previously formed underlying conductive interconnect layer, are simultaneously deposited. The conductive material is deposited into openings (e.g., via holes and trenches) created in dielectric material that overlays the conductive interconnect layer. Typically, a first layer of dielectric material is deposited over a bottom etch stop layer that covers and protects the conductive interconnect layer. A middle etch stop layer is then deposited over the first dielectric layer, followed by deposition of a second dielectric layer. A via hole is then etched through the second dielectric layer, the middle etch stop layer, and the second dielectric layer. A trench is then etched in the second dielectric layer. The trench at least partially overlaps the via hole. The etching of the trench thus stops at the middle stop layer. The bottom etch stop layer within the via hole, which has protected the conductive material in the conductive interconnect layer, is then removed with a different etchant chemistry. With the via holes now formed in the first dielectric layer and a trench formed in the second dielectric layer, conductive material is simultaneously deposited in the via and the trench in a single deposition step. (If copper is used as the conductive material, a barrier layer is conventionally deposited first, to prevent copper diffusion.) The conductive material makes electrically conductive contact with the conductive material in the underlying conductive interconnect layer.

In efforts to improve the operating performance of a chip, low k dielectric materials have been increasingly investigated for use as replacements for dielectric materials with higher k values. Lowering the overall k values of the dielectric layers employed in the metal interconnect layers lowers the RC of the chip and improves its performance. However, low k materials, such as benzocyclobutene (BCB), hydrogen silsesquioxane (HSQ), SiOF, and the material sold under the trade name of FLARE, are often more difficult to handle than traditionally employed higher k materials, such as an oxide.

When forming a dual damascene structure in which a low k dielectric material, such as BCB, is substituted for higher k dielectric materials in the two dielectric layers in which the vias and the trench are created, the problem of "undercutting" becomes a concern. Undercutting is the undesired enlargement of the via hole in the first dielectric layer, under the middle etch stop layer, during the etching of the trench in the second dielectric layer. The undercutting occurs since the low k dielectric material in the first dielectric layer reacts to the etchant when it is applied to the low k dielectric material in the second dielectric layer. The first dielectric layer is somewhat protected by the middle stop layer, but the etchant still often undercuts the first dielectric layer underneath the middle stop layer. The undercutting causes the ultimately formed via structure to be incorrectly shaped.

There is a need for a method and arrangement that provides a film with a lower overall dielectric constant value that will exhibit improved overall performance, yet avoids the undercutting that occurs with the use of a low k dielectric material in the dielectric layers of a dual damascene interconnect arrangement.

SUMMARY OF THE INVENTION

This and other needs are met by the present invention which provides a method of forming an opening in dielectric interconnect layers by forming a first dielectric layer over a conductive layer. The first dielectric layer comprises a first low k dielectric material. A nitride layer is formed on the first dielectric layer. A second dielectric layer is formed on the nitride layer. The second dielectric layer comprises a second low k dielectric material having different etch sensitivity than the first low k dielectric material to at least one etchant chemistry. A first opening is etched through the nitride layer and the first dielectric layer. A second opening is then etched in the second dielectric layer, the second opening at least partially overlapping the first opening.

The earlier stated needs are met by another embodiment of the present invention that provides a dual damascene arrangement having a conductive layer and a first dielectric layer over the conductive layer. The first dielectric layer comprises a first low k dielectric material. A nitride layer is on the first dielectric layer. A second dielectric layer is on the nitride layer and comprises a second low k dielectric material having different etch sensitivity than the first low k dielectric material to at least one etchant chemistry. A first opening extends through the nitride layer and the first dielectric layer to the conductive layer. A second opening extends through the second dielectric layer to the conductive layer. Conductive material fills the first and second openings.

The use of different low k materials in the respective dielectric layers of a dual damascene arrangement that are selected to have different etch sensitivity to at least one etchant chemistry, in accordance with embodiments of the present invention, allows one dielectric layer to be etched without etching and undercutting the other dielectric layer during a dual damascene formation process.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE INVENTION

The present invention solves problems associated with the use of low k dielectric materials in the dielectric layers of a dual damascene arrangement in a metal interconnect region of a semiconductor chip. Specifically, the present invention lowers the overall dielectric constant value of the film and avoids undercutting in the first dielectric layer by providing different low k dielectric materials in the two respective dielectric layers in a dual damascene arrangement. The different low k dielectric materials are selected so as to have different sensitivity to at least one etchant chemistry. This allows the second feature, such as a trench, to be etched into the second dielectric layer without simultaneously etching and thereby undercutting the first dielectric layer.

Figure 1:
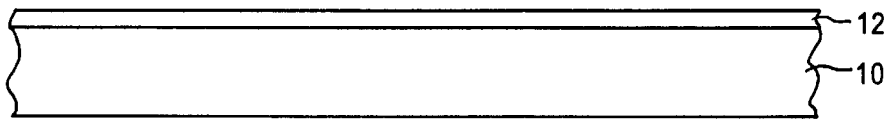
FIG. 1 is a cross-section of a metal interconnect portion of a semiconductor wafer after a first etch stop layer is deposited on an underlying conductive interconnect layer, in accordance with embodiments of the present invention.

FIG. 1 depicts a cross-section of a metal interconnect portion of a chip processed in accordance with embodiments of the present invention, at one stage of the processing. At this stage, a conductive layer 10 has been formed, which may be made of a metal, for example, or other conductive material. In especially preferred embodiments, the conductive material is copper or a copper alloy, due to the earlier stated advantages of copper over other metals. A first etch stop layer 12 is formed, by deposition, for example, over the conductive layer 10. The first etch stop layer 12, in certain embodiments, is made of silicon nitride. The primary purpose of the first etch stop layer 12 is to protect the conductive material during etching of the upper dielectric layers.

Figure 2:
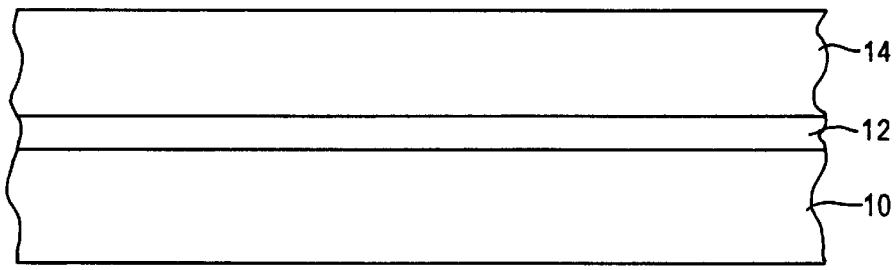
FIG. 2 is a cross-section of the metal interconnect portion of FIG. 1 after a first low k dielectric layer is formed on the first etch stop layer, in accordance with embodiments of the present invention.

As shown in FIG. 2, a first dielectric layer 14 is then formed on the first etch stop layer 12. The dielectric material in the first dielectric layer 14 is a low k (i.e., k<4) dielectric material. The low k dielectric material is spin-coated on the first dielectric layer 14 in certain embodiments. A number of different low k dielectric materials may be used to form the first dielectric layer 14. For example, the low k dielectric material may be a polymer based material, such as benzocyclobutene (BCB), FLARE, or SILK; or a silicon dioxide based material, such as hydrogen silsesquioxane (HSQ) or SiOF. In the following described first exemplary embodiment, the low k dielectric material employed in the first dielectric layer 14 is assumed to be a silicon dioxide based material, such as HSQ. Another embodiment will be described later in which the low k dielectric material employed in the first layer is a polymer based material.

The low k dielectric material may be formed to a desired thickness, depending on the application required. For purposes of example, assume that the dielectric layer 14 is formed to a thickness of between about 4000 and about 8000 Å.

Figure 3:
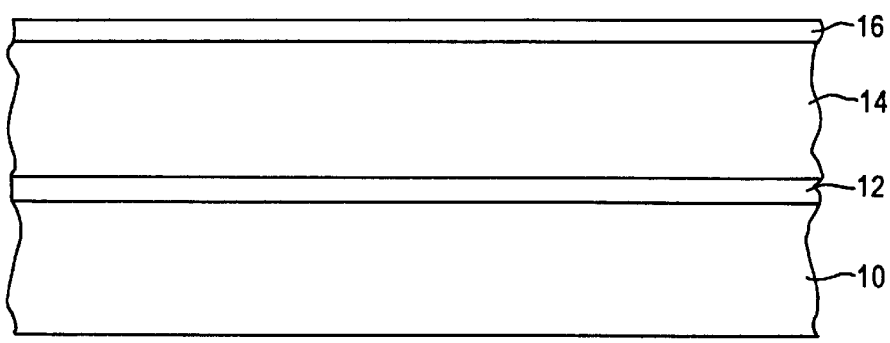
FIG. 3 is a cross-section of the metal interconnect portion of FIG. 2 following deposition of a second etch stop layer, on the first low k dielectric layer, in accordance with embodiments of the present invention.

A second (middle) etch stop layer 16 is deposited on the first dielectric layer 14, as depicted in FIG. 3. The second etch stop layer 16 comprises a nitride, such as silicon nitride, in preferred embodiments of the present invention. The first dielectric layer 14 is partially protected by the second etch stop layer 16 during the etching of the second dielectric layer when the trench is later formed in that layer.

Figure 4:
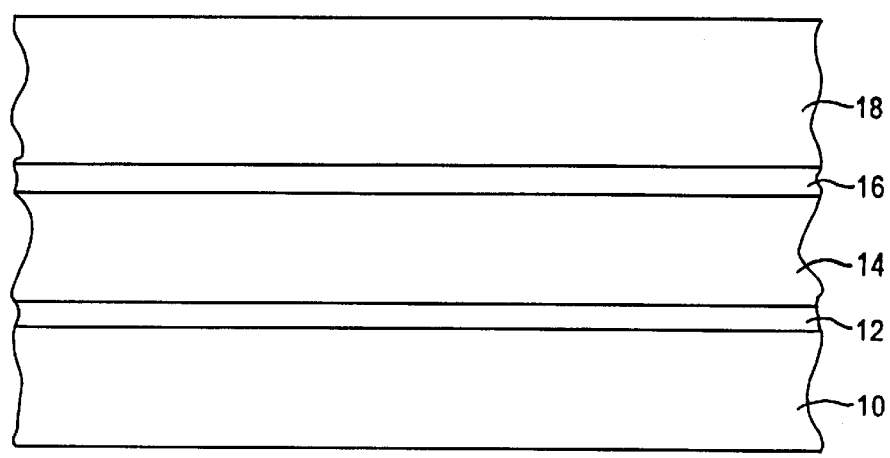
FIG. 4 is a cross-section of the portion of FIG. 3 following the formation of a second low k dielectric layer on the second etch stop layer, in accordance with embodiments of the present invention.

FIG. 4 is a cross-section of the metal interconnect portion of FIG. 3 following the formation of the second dielectric layer 18 over the second etch stop layer 16. In preferred embodiments of the present invention, the second dielectric layer 18 comprises a low k dielectric material that is spin-coated on the second etch stop layer 16. This material may be a silicon dioxide based low k dielectric material or a polymer based low k dielectric material. However, in order to avoid undercutting of the low k dielectric material in the first dielectric layer 14, the low k dielectric material in the second dielectric layer 18 needs to have a different sensitivity than the low k dielectric material in the first dielectric layer 14 to at least one etchant chemistry. This allows the second dielectric layer 18 to be etched while preventing significant etching of the first dielectric layer 14.

In the exemplary described embodiment, it has been assumed that the low k dielectric material in the first dielectric layer 14 is a silicon dioxide based low k dielectric material, such as HSQ. In order to achieve the desired difference in etching sensitivity (i.e., "selectivity"), the low k dielectric material comprising the second dielectric layer 18 is then selected to be a polymer based low k dielectric material, such as BCB. The advantages of providing different types of low k dielectric materials in the two dielectric layers 14, 18 will become more apparent during the later discussion of the etching steps.

Although the invention has been described with the assumption that the first dielectric layer 14 contains a silicon dioxide based low k dielectric material and the second dielectric layer 18 contains a polymer based low k dielectric material, in other embodiments of the invention, the first dielectric layer 14 contains a polymer based material and the second dielectric layer 18 contains a silicon dioxide based material. This embodiment will be described in more detail later.

Figure 5:
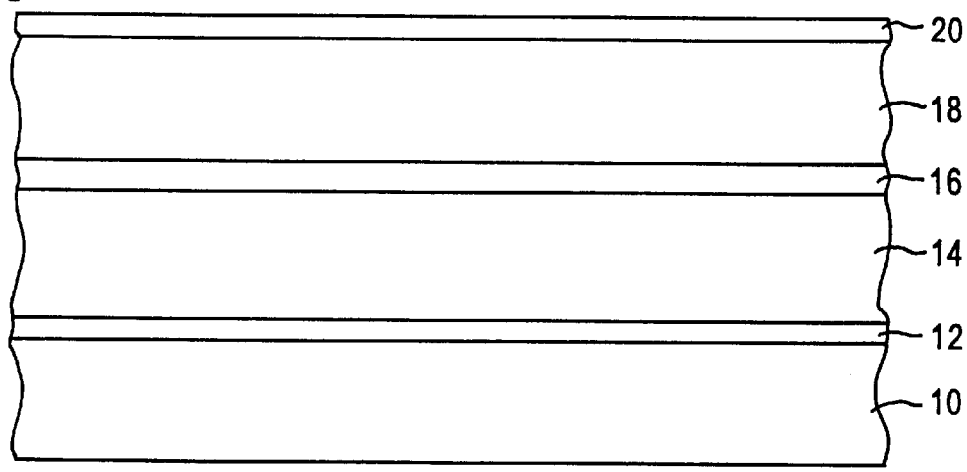
FIG. 5 is a cross-section of the portion of FIG. 4, following the deposition of a hard mask layer on the second low k dielectric layer, in accordance with embodiments of the present invention.

Following the formation of the second dielectric layer 18, a hard mask layer 20 is deposited on the second dielectric layer 18, as depicted in FIG. 5. The hard mask layer 20 may comprise silicon nitride, for example, and serves to selectively protect the second dielectric layer 18 during the etching steps.

Figure 6:
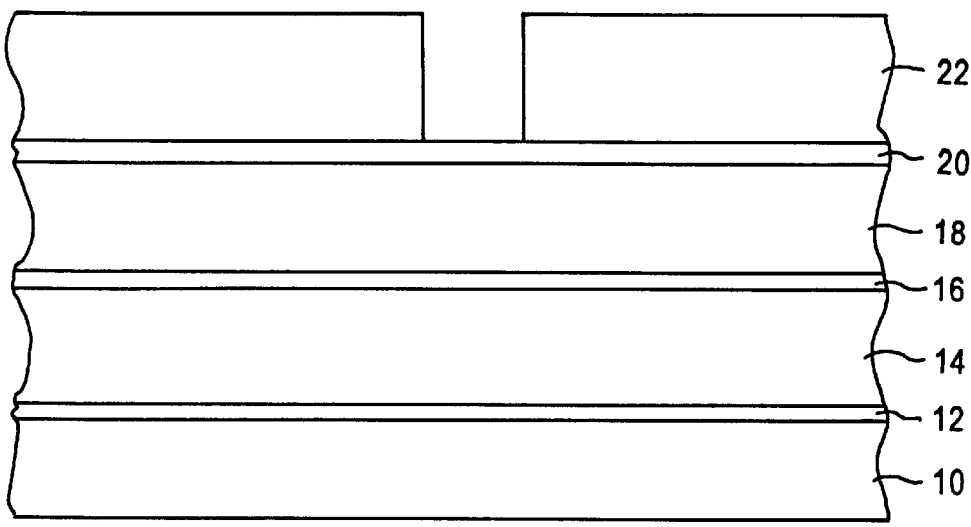
FIG. 6 is a cross-section of the portion of FIG. 5, following the positioning and patterning of a photoresist layer on the dielectric layer to define a first feature to be etched in the first and second low k dielectric layers, in accordance with embodiments of the present invention.

As shown in FIG. 6, a photoresist layer 22 is then positioned and patterned on the hard mask layer 20. The pattern in the photoresist layer 22 contains the feature that is to be etched into the first dielectric layer 14.

Figure 7:
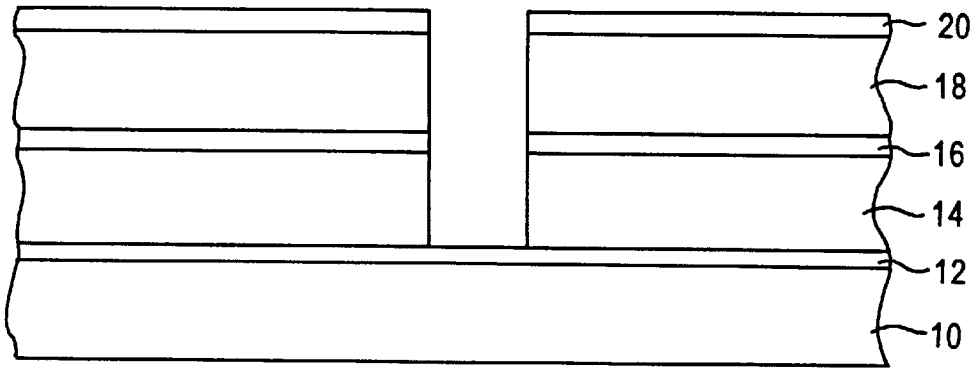
FIG. 7 is a cross-section of the portion of FIG. 6, after etching through the hard mask layer, the first and second low k dielectric layers and the second etch stop layer in accordance with the pattern in the photoresist layer to create a first feature in the first low k dielectric layer, in accordance with embodiments of the present invention.

The desired feature, such as a via opening (a "first" opening), is created (FIG. 7) by etching the hard mask layer 20, the second dielectric layer 18, the second etch stop layer 16, and the first dielectric layer 14. The etching stops at the first etch stop layer 12. A first etchant recipe may be employed that etches all of these layers. However, in preferred embodiments of the invention, multiple etching steps are used to create the structure depicted in FIG. 7. These include etching the hard mask layer 20, followed by etching the second dielectric layer 18, then etching the second etch stop layer 16, finally followed by etching the first dielectric layer 14. The photoresist layer 22 is typically removed by the etching process, such as during the removal of the low k polymer in the second dielectric layer 18. If not, a photoresist layer removal step can be performed.

A suitable etchant chemistry for etching the nitride hard mask layer 20 is CHF3/N2. The etchant chemistry employed to etch the second dielectric layer 18 (in this embodiment, a polymer based low k material) is $N_2/H_2/O_2$, or $N_2/H_2$ if the use of oxygen is to be avoided. For example, oxygen should not be used if HSQ is employed in the structure, as $O_2$ will damage the HSQ film. Also, the lack of $O_2$ in the etch process increases sidewall control during the etching of the polymer based dielectric layer. A slight amount of fluorine gas may be used in the etching of the low k polymer, depending on the specific polymer used. A suitable etchant chemistry for etching the second, middle etch stop layer 16, which in the exemplary embodiment is a nitride, is again $CHF_3/N_2$. Finally, the first dielectric layer 14, comprising an oxide based low k material, is etched with $C_4F_8/Ar/O_2/CO$. Alternative etchant chemistries for etching the first dielectric layer 14 may be $C_4F_8/Ar$ or $C_4F_8/C_2F_6$, for a non-oxygen process. The above listed etchant chemistries are exemplary only, as other chemistries may be employed without departing from the scope of the invention. The choice of the chemistry is selected based on the selectivity to the underlayer, etch rate and uniformity, and etch profile considerations, as is known to those of ordinary skill in the art.

Figure 8:
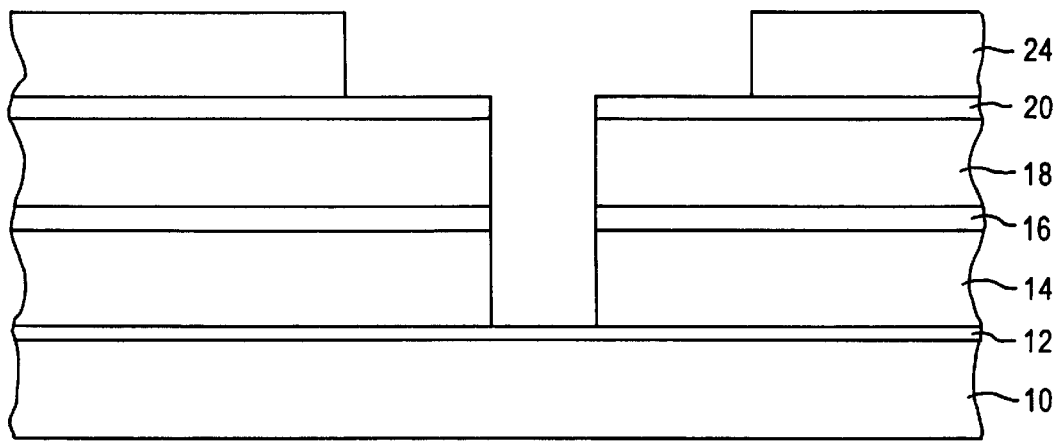
FIG. 8 is a cross-section of the portion of FIG. 7, following positioning and patterning of a photoresist layer on the hard mask layer to define a second feature to be etched in the second low k dielectric layer, in accordance with embodiments of the present invention.
Figure 9:
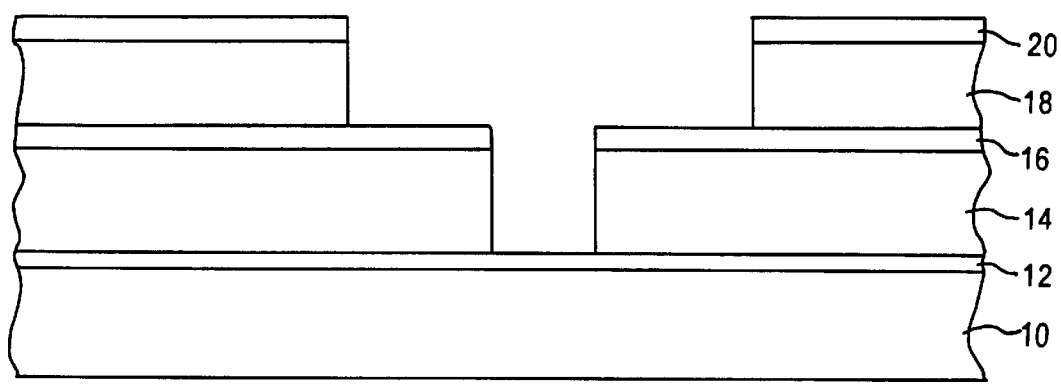
FIG. 9 is a cross-section of the portion of FIG. 8, after etching of the hard mask layer and the second dielectric layer to form the second feature, and removal of the photoresist layer, in accordance with embodiments of the present invention.

FIG. 8 depicts the cross-section after a second photoresist layer 24 has been positioned and patterned on the hard mask layer 20, following the etching of the first opening in the first dielectric layer 14. The photoresist layer 24 is patterned to contain an opening that defines a trench that will be etched into the second dielectric layer 18.

The hard mask layer 20 and the second dielectric layer 18 are etched through the photoresist layer 24 to create the second opening, such as a trench. This may be done with separate etching steps, one to remove the hard mask layer within the opening and the other to etch the low k material in the second dielectric layer 18. For example, the hard mask layer 20 is etched with $CHF_3/N_2$ within the trench opening defined by the photoresist layer 24. Further etching of the first dielectric layer 14 is only partially prevented by the second etch stop layer 16. Etching of the first dielectric layer 14 in an undercutting fashion that would not be prevented by the second etch stop layer 16 is nonetheless avoided by the use of an etchant chemistry that does not significantly etch the low k dielectric material in the first dielectric layer 14. For example, an etchant chemistry that etches the polymer based low k dielectric material in the second dielectric layer 18, but does not undercut the silicon dioxide based low k dielectric material in the first dielectric layer 14, is $N_2/H_2/O_2$, or $N_2/H_2$ (if non-oxygen processes are necessary). This is exemplary only, as other etchant chemistries may be used, provided they will etch the second dielectric layer 18 and not the first dielectric layer 14. The photoresist layer 24 will be removed during the etching of the second dielectric layer 18.

Figure 10:
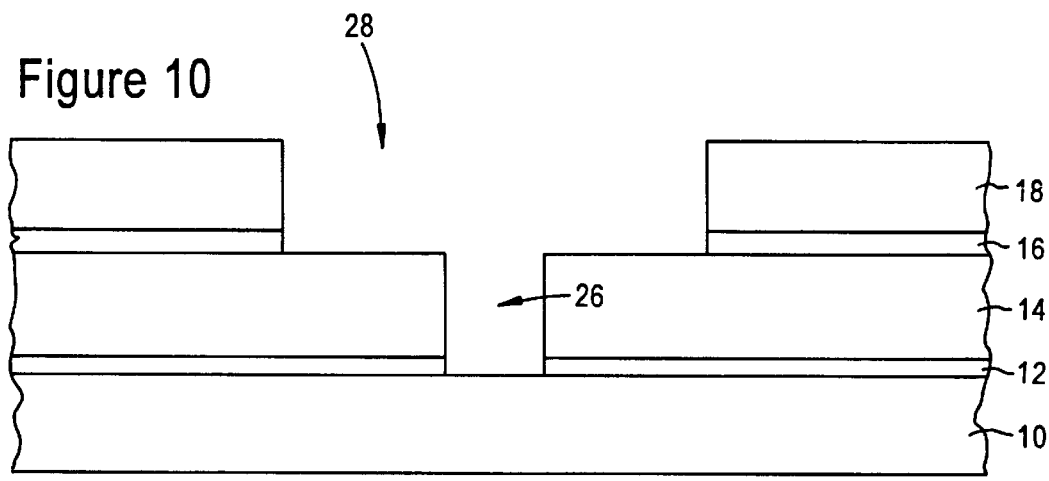
FIG. 10 is a cross-section of the portion of FIG. 9, following the etching of the first etch stop layer, in accordance with certain embodiments of the present invention.

The first etch stop layer 12 is now etched within the first opening that now exists in the first dielectric layer 14, as seen in FIG. 10. This removes the etch stop material covering the conductive material in the conductive layer 10. A suitable etchant to remove the etch stop material, for example silicon nitride, while not adversely affecting the conductive material (e.g., copper) is $N_2/H_2$. The etching of the first etch stop layer 12 leaves a first opening 26, such as a via hole, and a second opening 28, such as a trench.

Figure 11:
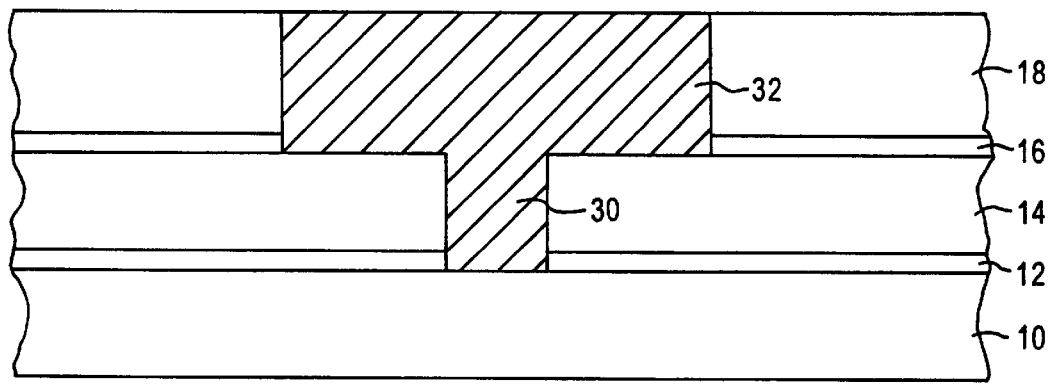
FIG. 11 is a cross-section of the portion of FIG. 10 after the first and second features are filled with a conductive material, in accordance with embodiments of the present invention.

After removal of any remaining photoresist 24, the via hole 26 and the trench 28 are now filled in a simultaneous deposition step with conductive material, preferably copper in certain embodiments of the present invention. After chemical mechanical planarization (CMP), the dual damascene structure of FIG. 11 is formed, having a via (or stud) 30 electrically connecting the underlying conductive layer 10 to a conductive line 32 formed in the trench 28.

In the earlier mentioned alternative embodiment, the first dielectric layer 14 is a polymer based low k material and the second dielectric layer 18 is an oxide based low k material. In this second embodiment, the same etchant chemistries as in the first described embodiment are employed to etch the different materials. However, in this embodiment, the hard mask layer 20 is not required, as the low k oxide in the second dielectric layer 18 serves as a pattern for the contact opening to be created in the low k polymer of the first dielectric layer 14. One advantage of using the low k polymer in the first dielectric layer 14, in which the contact opening is formed, is that the low k polymer is etched only one time, rather than twice as in the first described embodiment This feature is advantageous since it is normally difficult to maintain an anisotropic etch with low k polymer materials.

The use of different types of low k dielectric materials that exhibit different sensitivity to at least one etchant chemistry, permits the use of low k dielectric materials in the multiple layers of a dual damascene arrangement, while avoiding the concern of undercutting in one of the dielectric layers. This use of low k dielectric materials provides a chip with lower overall RC and therefore an improved operating speed.

Although the present invention has been described and illustrated in detail, it is to be early understood that the same is by way of illustration and example only and is not to be taken by way of limitation, the spirit and scope of the present invention being limited only by the terms of the appended claims.

What is claimed is:

1. A dual damascene arrangement comprising:

a conductive layer;

a first dielectric layer over the conductive layer, the first dielectric layer comprising a first low k dielectric material;

a nitride layer on the first dielectric layer;

a second dielectric layer on the nitride layer, the second dielectric layer comprising a second low k dielectric material having different etch sensitivity than the first low k dielectric material to at least one etchant chemistry;

a first opening extending through the nitride layer and the first dielectric layer to the conductive layer;

a second opening extending through the second dielectric layer to the nitride layer; and conductive material filling the first and second openings.

2. The arrangement of claim 1, wherein the conductive layer comprises copper or a copper alloy.

3. The arrangement of claim 2, wherein the first low k dielectric material is an oxide based dielectric material and the second low k dielectric material is a polymer based material.

4. The arrangement of claim 3, wherein the first low k dielectric material is selected from one of hydrogen silsesquioxane (HSQ) and SiOF, and the second low k dielectric material is selected from one of BCB, FLARE and SILK.

5. The arrangement of claim 4, wherein the first low k dielectric material is a polymer based material and the second low k dielectric material is an oxide based material.

6. The arrangement of claim 5, wherein the first low k dielectric material is selected from one of BCB, FLARE and SILK, and the second low k dielectric material is selected from one of HSQ and SiOF.

7. The arrangement of claim 1, wherein the conductive material filling the first and second openings comprises copper or a copper alloy.

* * * * *